(12) United States Patent
Chen et al.

(10) Patent No.: US 9,764,946 B2
(45) Date of Patent: Sep. 19, 2017

(54) MEMS DEVICE WITH OUTGASSING SHIELD

(71) Applicant: Analog Devices, Inc., Norwood, MA (US)

(72) Inventors: Li Chen, Belmont, MA (US); Thomas Kieran Nunan, Carlisle, MA (US); Kuang L. Yang, Newton, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 14/062,157

(22) Filed: Oct. 24, 2013

(65) Prior Publication Data

US 2015/0115376 A1    Apr. 30, 2015

(51) Int. Cl.
| | | |
|---|---|---|
| H01L 29/84 | (2006.01) | |
| B81B 7/00 | (2006.01) | |
| B81B 3/00 | (2006.01) | |
| B81C 1/00 | (2006.01) | |
| B81C 3/00 | (2006.01) | |

(52) U.S. Cl.
CPC ......... *B81B 7/0035* (2013.01); *B81B 3/0094* (2013.01); *B81B 7/0041* (2013.01); *B81C 1/00293* (2013.01); *B81C 3/001* (2013.01); *B81B 2201/0235* (2013.01); *B81B 2207/012* (2013.01); *B81B 2207/095* (2013.01); *B81C 2203/019* (2013.01)

(58) Field of Classification Search
CPC ......... H01L 2924/00; H01L 2924/1461; B81B 2201/0235; B81B 2201/0242; B81C 3/001
USPC ...................................... 257/415; 438/50, 51
See application file for complete search history.

(56) References Cited

U.S. PATENT DOCUMENTS

| | | | |
|---|---|---|---|
| 5,591,679 A | 1/1997 | Jakobsen et al. | 437/228 |
| 6,376,787 B1 * | 4/2002 | Martin et al. | 200/181 |
| 6,384,353 B1 * | 5/2002 | Huang et al. | 200/181 |
| 6,505,511 B1 | 1/2003 | Geen et al. | |
| 6,852,926 B2 | 2/2005 | Ma et al. | 174/52.2 |
| 7,017,411 B2 | 3/2006 | Geen et al. | |
| 7,034,393 B2 | 4/2006 | Alie et al. | 257/704 |
| 7,075,160 B2 | 7/2006 | Partridge et al. | 257/414 |
| 7,102,220 B2 | 9/2006 | Stevens et al. | 257/686 |
| 7,104,129 B2 | 9/2006 | Nasiri et al. | 73/514.29 |

(Continued)

FOREIGN PATENT DOCUMENTS

| | | | | |
|---|---|---|---|---|
| CN | 1599061 A | 3/2005 | | H01L 23/12 |
| CN | 1762788 A | 4/2006 | | B81C 1/00 |

(Continued)

OTHER PUBLICATIONS

International Searching Authority, International Search Report—International Application No. PCT/US2014/061346, dated Jan. 9, 2015, together with the Written Opinion of the International Searching Authority, 9 pages.

*Primary Examiner* — Andy Huynh
(74) *Attorney, Agent, or Firm* — Wolf, Greenfield & Sacks, P.C.

(57) ABSTRACT

A capped micromachined device has a movable micromachined structure in a first hermetic chamber and one or more interconnections in a second hermetic chamber that is hermetically isolated from the first hermetic chamber, and a barrier layer on its cap where the cap faces the first hermetic chamber, such that the first hermetic chamber is isolated from outgassing from the cap.

20 Claims, 11 Drawing Sheets

(56) References Cited

U.S. PATENT DOCUMENTS

| | | | |
|---|---|---|---|
| 7,204,737 B2 | 4/2007 | Ding et al. .................... 445/24 |
| 7,449,355 B2 | 11/2008 | Lutz et al. |
| 7,595,209 B1 | 9/2009 | Monadgemi et al. |
| 7,763,962 B2 | 7/2010 | Pan et al. |
| 8,039,950 B2 | 10/2011 | Oldsen et al. ............... 257/704 |
| 8,058,144 B2 | 11/2011 | Bhagavat et al. |
| 8,217,473 B2 | 7/2012 | Chen et al. .................. 257/414 |
| 8,349,635 B1* | 1/2013 | Gan .................... G01L 9/0019 257/E23.18 |
| 8,350,346 B1 | 1/2013 | Huang et al. ................ 257/415 |
| 2002/0093003 A1 | 7/2002 | Conte et al. ................ 252/181.1 |
| 2005/0166677 A1 | 8/2005 | Nasiri et al. ................ 76/514.16 |
| 2006/0071324 A1* | 4/2006 | Lu .................... B81C 1/00269 257/704 |
| 2006/0105503 A1* | 5/2006 | Ding .................... B81B 7/007 438/125 |
| 2006/0246631 A1 | 11/2006 | Lutz et al. |
| 2007/0103028 A1* | 5/2007 | Lewis et al. ................ 310/300 |
| 2008/0317995 A1 | 12/2008 | Oldsen et al. ............... 428/98 |
| 2009/0294879 A1 | 12/2009 | Bhagavat et al. ........... 257/415 |
| 2010/0068854 A1 | 3/2010 | Schirmer et al. |
| 2010/0139373 A1 | 6/2010 | Braman et al. |
| 2012/0043627 A1 | 2/2012 | Lin et al. .................... 257/415 |
| 2012/0112334 A1 | 5/2012 | Baillin et al. ................ 257/682 |
| 2012/0326248 A1 | 12/2012 | Daneman et al. ........... 257/415 |
| 2013/0105959 A1 | 5/2013 | Baillin et al. ................ 257/682 |
| 2013/0181355 A1* | 7/2013 | Tsai .................... B81C 1/0023 257/774 |
| 2014/0070339 A1* | 3/2014 | Marx et al. .................. 257/415 |

FOREIGN PATENT DOCUMENTS

| | | | |
|---|---|---|---|
| CN | 101233073 A | 7/2008 | .............. B81C 3/00 |
| CN | 102583219 A | 7/2012 | .............. B81B 7/00 |
| JP | 2007-513796 A | 5/2007 | .............. B81B 3/00 |
| JP | 2009-14469 A | 1/2009 | .............. G01P 15/08 |
| JP | 2009-502531 A | 1/2009 | .............. B81C 3/00 |
| JP | 2009-59941 | 3/2009 | .............. H01L 23/04 |
| JP | 2009-59941 A | 3/2009 | .............. H01L 23/04 |
| JP | 2009-516365 A | 4/2009 | .............. H01L 23/02 |
| KR | 2002-0085991 A | 11/2002 | .............. H01L 23/522 |
| TW | 200304682 A | 10/2003 | .............. H01L 21/44 |

* cited by examiner

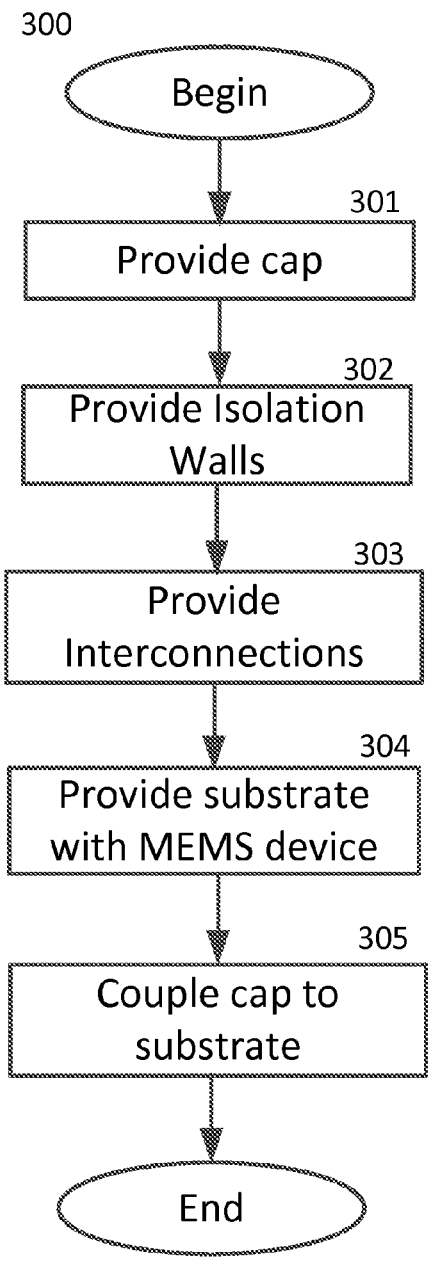
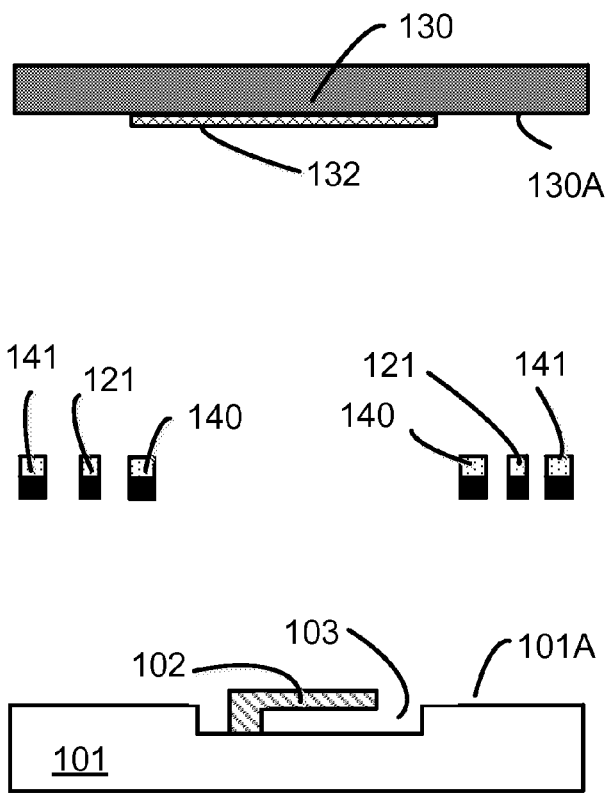
Fig. 3A
Fig. 3B

MEMS DEVICE WITH OUTGASSING SHIELD

TECHNICAL FIELD

The present invention relates to micromachined ("MEMS") devices, and more particularly to packaging for MEMS devices.

BACKGROUND ART

It is known in the prior art to hermetically cap a MEMS device, and to make electrical connections between the MEMS device and a related integrated circuit via wire bonds outside of the hermetic cap.

It is also known to attach the related integrated circuit to the substrate of the MEMS device via a seal ring, such that the related integrated circuit acts as a cap to hermetically seal the MEMS device in a cavity. Such devices make the electrical connections between the MEMS device and the capping integrated circuit by providing electrically conductive interconnections extending directly between the substrate and related integrated circuit within the hermetic cavity.

However, it is known that typical backend films used for inter-metal isolation and top passivation in integrated circuits, such as PECVD oxide and PECVD nitride for example, can release (i.e., "outgas") gasses into the cavity. Such gasses, once released into the inside of the device's hermetically sealed cavity, can cause much higher sealed pressure than desired, and adversely impact the performance of the MEMS device. For example, such gasses may cause an accelerometer or gyroscope to fail to meet their respective specifications. Even for devices that do not require a low pressure cavity environment within a cavity, this outgas can cause the pressure to be at or about 1 atmosphere, so the basic Q measurement for hermeticity screening may not be possible.

SUMMARY OF THE EMBODIMENTS

In a first embodiment, a capped micromachined device includes a MEMS structure in a MEMS chamber, and a cap that includes an outgassing shield configured to prevent outgassing from the cap from entering the MEMS chamber. In particular, the capped micromachined device includes a substrate having a MEMS structure suspended from a substrate, and at least a first electrical conductor coupled to the MEMS structure and to the cap. In various embodiments, the MEMS structure may be one of an accelerometer beam, a gyroscope structure, and a switch arm, to name but a few examples.

The device also includes a cap suspended parallel to the substrate and separated from the substrate by a capping gap. The cap includes at least a second electrical conductor, such as doped conductive lines or metal interconnections on the surface of, or within, the cap. In some embodiments, the cap is an integrated circuit including a plurality of active semiconductor devices. Indeed, in some embodiments, the cap is an integrated circuit configured to process output signals from the MEMS structure.

The device also includes a first isolation wall disposed between the substrate and the cap and spanning the capping gap, the first isolation wall and the substrate defining a MEMS chamber enclosing the MEMS structure such that the MEMS structure is movable within the MEMS chamber.

In addition, a shield layer is disposed between a face of the cap and the MEMS chamber (e.g., on a face of the cap) and configured to provide a complete outgas barrier between the face of the cap and the MEMS chamber. In other words, the shield layer is disposed between a region of a face of the cap and the MEMS chamber, the region of the face of the cap being a portion of the face of the cap that is directly opposite the MEMS chamber. In some embodiments, the shield layer includes one of titanium nitride and a titanium and titanium nitride combo layer stack.

A second isolation wall is also disposed between the substrate and the cap, and spans the capping gap. The second isolation wall, the substrate and the cap define an interconnection chamber, the interconnection chamber hermetically sealed and hermetically isolated from the MEMS chamber. In this way, the MEMS chamber is hermetically isolated from the cap and the interconnection chamber, and the MEMS structure is electrically coupled to the second electrical conductor.

In various embodiments, the first isolation wall, and or the second isolation wall, may include a solder ring, a glass frit, or a metal seal ring.

The arrangement of the first isolation wall and the second isolation wall may define the MEMS chamber and the interconnect chamber in a variety of configurations. For example, in some embodiments, the MEMS chamber is adjacent to the interconnect chamber, while in other embodiments the MEMS chamber is surrounded by the interconnect chamber.

In some embodiments, the MEMS chamber and the interconnect chamber both enclose an identical initial internal environment.

In some embodiments, the shield layer may be coupled to a voltage source configured to supply a fixed electrical potential, such as a D.C. voltage or ground, to the shield layer.

Finally, the device includes an interconnection structure disposed within the interconnection chamber and spanning the capping gap, the interconnection structure electrically coupling the first electrical conductor to the second electrical conductor.

A method of fabricating a capped micromachined device includes providing a substrate having a MEMS structure suspended from the substrate, and at least a first electrical conductor coupled to the MEMS structure.

The method also includes providing a cap, the cap having at least a second electrical conductor, and a shield layer on a face of the cap. In some embodiments, the cap includes an integrated circuit including a plurality of active semiconductor devices. Indeed, in some embodiments, the method provides a cap that is an integrated circuit configured to process output signals from the MEMS structure. In some embodiments, the shield layer is one of titanium nitride and a titanium and titanium nitride combo layer stack.

In addition, the method provides a first isolation wall configured to extend between the substrate and the cap; and provides a second isolation wall configured to extend between the substrate and the cap. In some embodiments, each of the first isolation wall and the second isolation wall includes a metal seal ring. In some embodiments, the second isolation wall includes one of a solder ring or a glass frit.

Also, the method provides an interconnection structure configured to extend between the substrate and the cap.

The method also includes coupling the cap to the substrate such that the first isolation wall, the second isolation wall, and the interconnection structure span a capping gap between the cap and the substrate. Accordingly, the cap and the first isolation wall define a MEMS chamber enclosing the MEMS structure such that at least a portion of the MEMS structure is movable within the MEMS chamber, with the shield layer disposed so as to provide a complete gas barrier between the face of the cap and the MEMS chamber. Similarly, the cap and the second isolation wall define an interconnection chamber, such that the interconnection chamber is hermetically sealed and hermetically isolated from the MEMS chamber. The interconnection structures are thus disposed within the interconnection chamber and electrically couple the first electrical conductor to the second electrical conductor.

In another embodiment, a capped micromachined device includes a substrate means having a MEMS structure suspended from the substrate means, and at least a first electrical conductor coupled to the MEMS structure, and a cap means including at least a second electrical conductor. The substrate means and the cap means are configured such that when the substrate means is coupled to the cap means, the substrate means and the cap means form a MEMS chamber enclosing the MEMS structure such that the MEMS structure is movable within the MEMS chamber, as well as an interconnection chamber. The interconnection chamber is hermetically sealed and hermetically isolated from the MEMS chamber. The capped micromachined device also includes an interconnection means disposed within the interconnection chamber, the interconnection structure electrically coupling the first electrical conductor to the second electrical conductor.

In some embodiments, the cap means includes an integrated circuit means including a plurality of active semiconductor devices, at least one of the active semiconductor devices electrically coupled to the MEMS structure via the first electrical conductor, the interconnection means, and the second electrical conductor. Indeed, in some embodiments the cap means is an integrated circuit means configured to process output signals from the MEMS structure.

In some embodiments, the shield layer means includes a layer of titanium nitride, or a TI/TiN combo layer, disposed on the cap means.

BRIEF DESCRIPTION OF THE DRAWINGS

The foregoing features of embodiments will be more readily understood by reference to the following detailed description, taken with reference to the accompanying drawings, in which:

FIG. 3A is a flow chart that schematically illustrates an embodiment of a method of fabricating a capped MEMS device having a MEMS chamber that is hermetically isolated from interconnections;

FIG. 3B schematically illustrates various portions of a capped MEMS device corresponding to the flow chart of FIG. 3A;

DETAILED DESCRIPTION OF SPECIFIC EMBODIMENTS

Figure 1A:
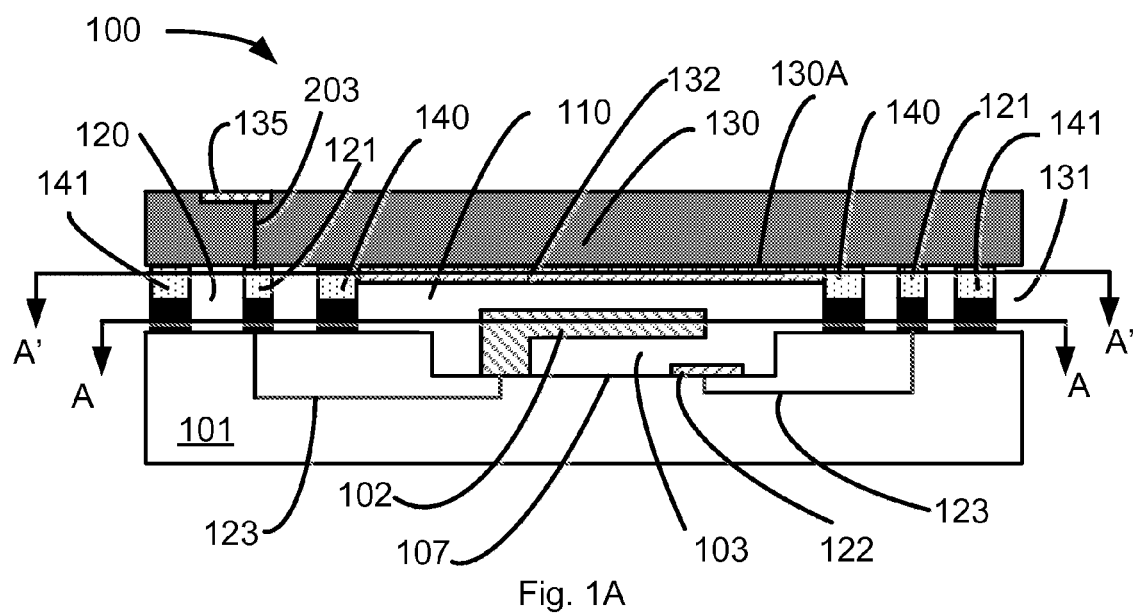
FIGS. 1A and 1B and 1C schematically illustrate a first embodiment of a capped MEMS device having a MEMS chamber that is hermetically isolated from interconnections.

Various embodiments isolate the movable micromachined (or "MEMS") structures in a capped MEMS device from outgassing that may occur from the cap. For example, the cap may include an outgassing shield to prevent gas from the cap from entering a MEMS chamber covered by the cap. If a MEMS device includes electrical connections from the MEMS structure to the cap, a "bare" portion of the cap does not include an outgassing shield so that the electrical connections may physically and electrically couple to the cap, but that bare portion of the cap is isolated from the MEMS chamber so that outgassing from the bare portion of the cap does not enter the MEMS chamber. In other words, various embodiments isolate electrical connections in a MEMS sensor from the movable MEMS structure by segregating the movable MEMS structure by sealing the MEMS structure in a hermetically sealed cavity or chamber. Indeed, some embodiments segregate the interconnections and the movable MEMS structure into separate cavities or chambers that are hermetically isolated from one another—a MEMS chamber that is shielded from the cap for housing the MEMS structure, and an interconnect chamber for housing the interconnections. In this way, the interconnections may physically and electrically couple to the cap, while the MEMS structure may be protected from outgassing from the cap into the MEMS chamber.

DEFINITIONS

As used in this description and the accompanying claims, the following terms shall have the meanings indicated, unless the context otherwise requires:

The term "initial internal environment" means, with respect to a hermetically sealed cavity, chemical content, temperature and pressure of the gas within the cavity at the time of manufacture. For example, two hermetically sealed cavities would have the same initial internal environment if they were sealed at the same time in the same environment. However, two hermetically sealed cavities may have the same initial internal environment even if they are not sealed at the same time, for example if their respective internal environments, at the time of their respective sealing, are the same.

The term "active circuit" means a circuit including one or more transistors (or "active devices" or "active semiconductor devices"). In various embodiments, such active circuits may be configured as buffers, amplifiers, analog-to-digital converters or digital circuits, to name but a few embodiments. A device that includes active circuits may also include passive circuit elements (e.g., capacitors) as well as conductive elements (e.g., wires) for interconnecting circuit features, along with its active circuits.

The term "hermetically isolated" when used in connection with a cavity or chamber means that gas from an adjacent structure, cavity or chamber cannot pass into the cavity or chamber. The term "hermetically isolated" when used in connection with a cavity or chamber and a cap, means that gas from the cap cannot pass into the cavity or chamber.

The term "titanium and titanium nitride combo layer stack" means a structure including portions consisting of or including titanium and/or titanium-nitride ("TiN"). For example, a seal ring between two semiconductor members (e.g., a MEMS substrate and a cap) may include a titanium and titanium nitride combo layer stack.

The term "semiconductor cap" means a cap that has, or includes or is fabricated from, a material such as silicon, doped silicon, germanium, or doped germanium, to name but a few examples.

A "complete barrier" (or "complete outgas barrier"), when used to describe a shield between a cap and a MEMS cavity, is a barrier that is impermeable to gas that may outgas from a cap, and that covers a region of a surface of the cap at all points where that surface interfaces to the MEMS cavity. If any portion of the surface of the cap is exposed to the MEMS cavity such that gas that is outgassed from the cap may directly enter the MEMS cavity, then the barrier is not complete.

The term "span" when used, for example, to describe a barrier wall between a substrate and a cap means that the barrier wall extends the entire distance or gap between the substrate and the cap.

Figure 1B:
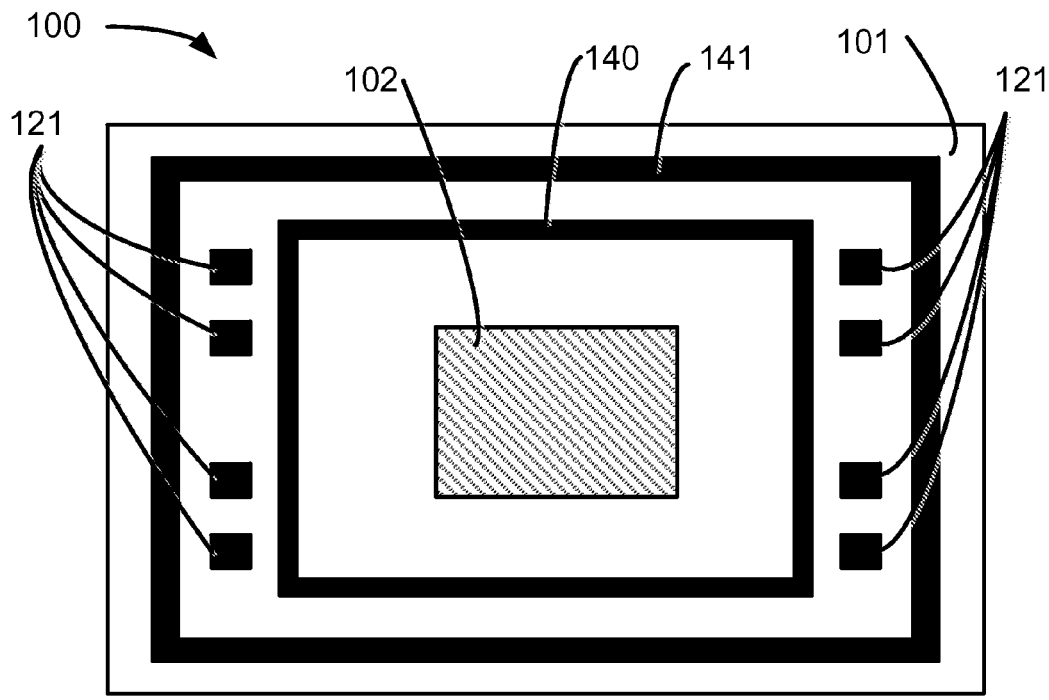

FIG. 1A and FIG. 1B schematically illustrate a first embodiment, in which a micromachined device 100 includes a MEMS structure 102 hermetically sealed in a first cavity. At least a portion of the MEMS structure 102 is movable with respect to the substrate. Other portions of the MEMS device (which may be considered to be part of the overall MEMS structure) may not be movable with respect to the substrate, such as electrode 122 for example. FIG. 1B is a cross-section of device 100 along line A-A, but also shows some of the substrate 101, for reference.

The micromachined structure 102 is suspended from a substrate 101 and movable with respect to the substrate 101. The micromachined structure may be a part of any of a variety of micromachined structures, such as an accelerometer, a gyroscope, or a cantilevered switch or relay, to name but a few examples. Although the micromachined structure 102 is schematically illustrated as sitting in a well 103 within substrate 101, this is for illustration only and is not a limitation of any embodiment.

The micromachined device 100 also includes a cap (or "roof") 130 coupled to the substrate 101 and spaced from the substrate by a capping gap 131. In illustrative embodiments, the cap 130 is parallel to the substrate. Generally, the cap 130 includes a material capable of outgassing a gas.

In some embodiments, the cap 130 may be a semiconductor or be made of semiconductor material, such as silicon or germanium, to name but a few examples. Such a cap may be referred to as a "semiconductor cap." For example, a cap may be an integrated circuit ("I.C.") or an application-specific integrated circuit ("ASIC"), having one or more active circuits 135 configured to buffer process signals output from the MEMS structure 102.

Figure 2A:
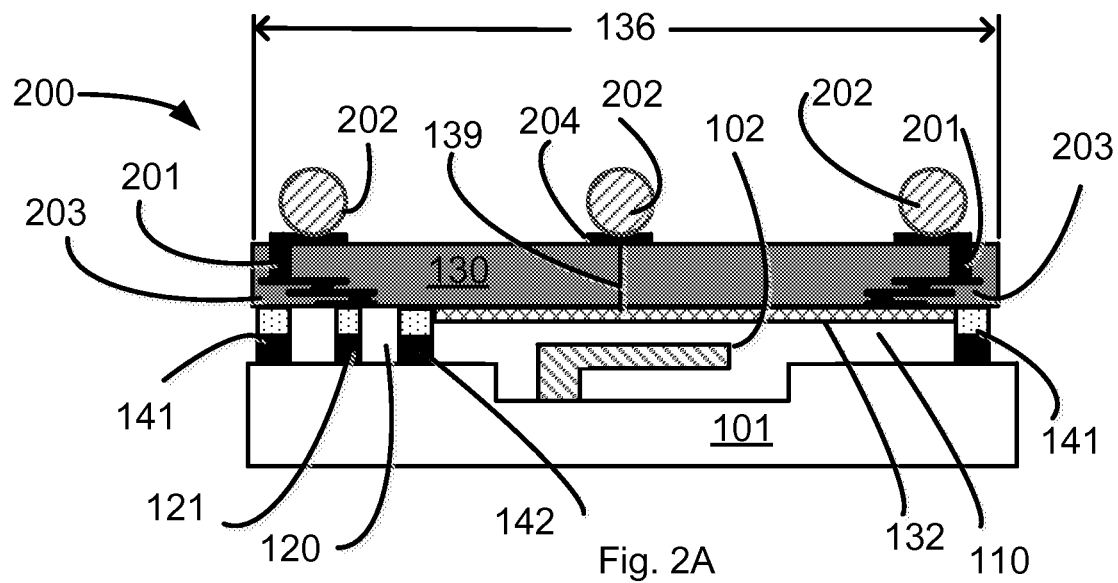
FIG. 2A schematically illustrates an embodiment of a capped MEMS device having a MEMS chamber that is hermetically isolated from interconnections and through-silicon vias and solder balls.

In other embodiments, the cap 130 may include through-silicon vias (each a "TSV") 201 and/or other electrical conductors 203 configured to carry an electrical signal from the MEMS structure 102 to a bond pad 204 or solder ball 202 on a side of the cap 130 opposite the side that faces the substrate 101, as schematically illustrated in embodiment 200 in FIG. 2A. Indeed, some embodiments may have both active circuits and through-silicon vias (see, e.g., cap 130 in FIG. 2A).

Figure 2B:
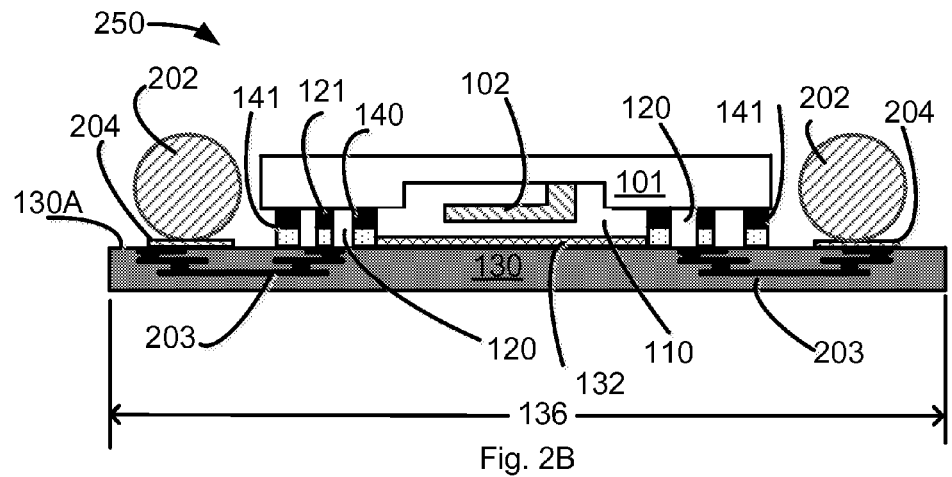
FIGS. 2B and 2C schematically illustrates an alternate embodiment of a capped MEMS device having a MEMS chamber that is hermetically isolated from interconnections and having solder balls.
Figure 2C:
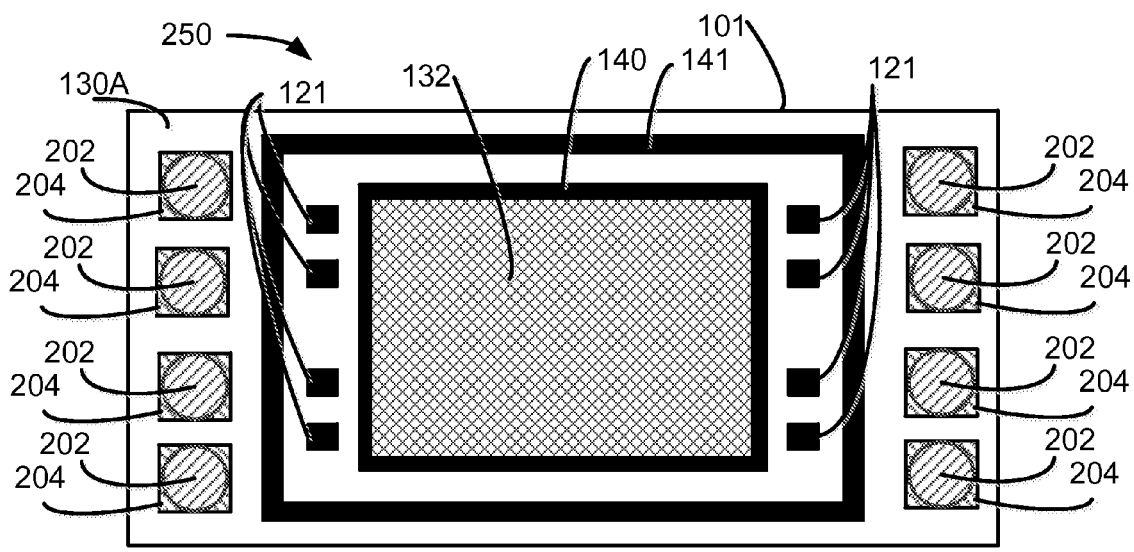

In another embodiment 250, the cap 130 includes conductors 203 configured to couple interconnections 121 to solder balls 202 on the same side of the cap (i.e., surface or side 130A) as the MEMS substrate 101, as schematically illustrated in FIG. 2B and FIG. 2C. Here, FIG. 2C schematically illustrates a cross-section of the device 250 in FIG. 2B along the plane of the surface 130A, and also shows features coupled to that surface 130A, such as pads 204, solder balls 202, and shield layer 132. The conductors electrically couple to interconnects 121 at the surface 130A of the cap 130, and also interface to the solder ball 222, via solder pads 204, at another place on the surface 250 of the cap 130. As such, the conductors 203 meet the surface 250 at two distinct locations, and serve to electrically couple the MEMS structure 102 to one or more solder balls 222 via the cap 130. As such, the device 250 may be mounted to a substrate 702 via the solder balls 222, such that the MEMS substrate 101 is suspended from cap 130 and between the substrate 702 and the cap 130, as schematically illustrated by assembly 720 in FIG. 7B, for example.

As such, active circuits in the cap 130, and/or other electrical interfaces such as bond pads 204 and solder balls 202, may be electrically coupled to the MEMS structure 102 or other features of the substrate (e.g., electrode 122) via conductors 123 in substrate 101 that are coupled to the MEMS structure 102, via contact pads or interconnections 121 spanning the capping gap 131 between the substrate 101 and the cap 130, and via conductors 203 in the cap 130.

The substrate 101 and the cap 130 are coupled together by an inner seal ring 140 and an outer seal ring 141. Either or both of the seal rings 140, 141 (which may also be known as isolation walls), may be metal (e.g., a metal seal ring, such as a TiN stack), or aluminum-copper, a solder ring, or glass frit for example.

Both seal rings 140, 141 extend across the capping gap 131, so that the substrate 101, the cap 130, and the seal rings 140, 141 form the two hermetically sealed cavities 110 and 120. More specifically, the inner seal ring 140 circumscribes the MEMS structure 102, and forms hermetic cavity 110 (the MEMS cavity or MEMS chamber) along with the substrate 101 and the cap 130. The outer seal ring 141 circumscribes the inner seal ring, and therefore circumscribes the inner MEMS cavity 110, to form outer cavity 120 (or outer chamber 120). The outer seal ring 141 circumscribes the connectors 121, so that the connectors 121 are hermetically sealed within the interconnection cavity 120. As such, in this embodiment, the outer cavity 120 may be described as having an annular shape around the MEMS cavity 110. Alternately, the outer cavity 120 may be said to surround the MEMS cavity 110, or the MEMS cavity 110 is surrounded by the interconnect cavity 120.

In some embodiments, including the MEMS device 100 schematically illustrated in FIGS. 1A and 1B, a shield layer 132 is disposed between (or in physical contact with) a surface 130A of the cap 130 and the MEMS cavity 110, for example to prevent outgassing from the cap 130 into the MEMS cavity 110. In preferred embodiments, the shield layer 132 is impermeable to outgassing, and covers the surface 130A at all points where that surface 130A interfaces to the MEMS cavity 110. For example, the shield layer 132 may extend across the surface 130A to form a complete barrier (or "outgas barrier") spanning the inner seal ring 140 and/or walls 141 and 142. Indeed, in some embodiments, the shield layer 132 may be fabricated from the same material as the inner seal ring 140. In some embodiments, the shield layer 132 may include titanium nitride, or a titanium and titanium nitride ("Ti/TiN") combo layer stack. In other embodiments, the shield layer 132 may include Tungsten ("W"), Titanium Tungsten ("TiW") or metal silicides such as Titanium Silicide (TiSi) etc., along with metal (e.g., AlCu; AlGe) seal ring 140 spanning the capping gap at the periphery 134 of the shield layer. Generally, in any embodiment described herein, the shield layer 132 and the seal ring 140, and even the barrier walls 141 and 142, may include the same metals and be fabricated by the same process steps.

Figure 1C:
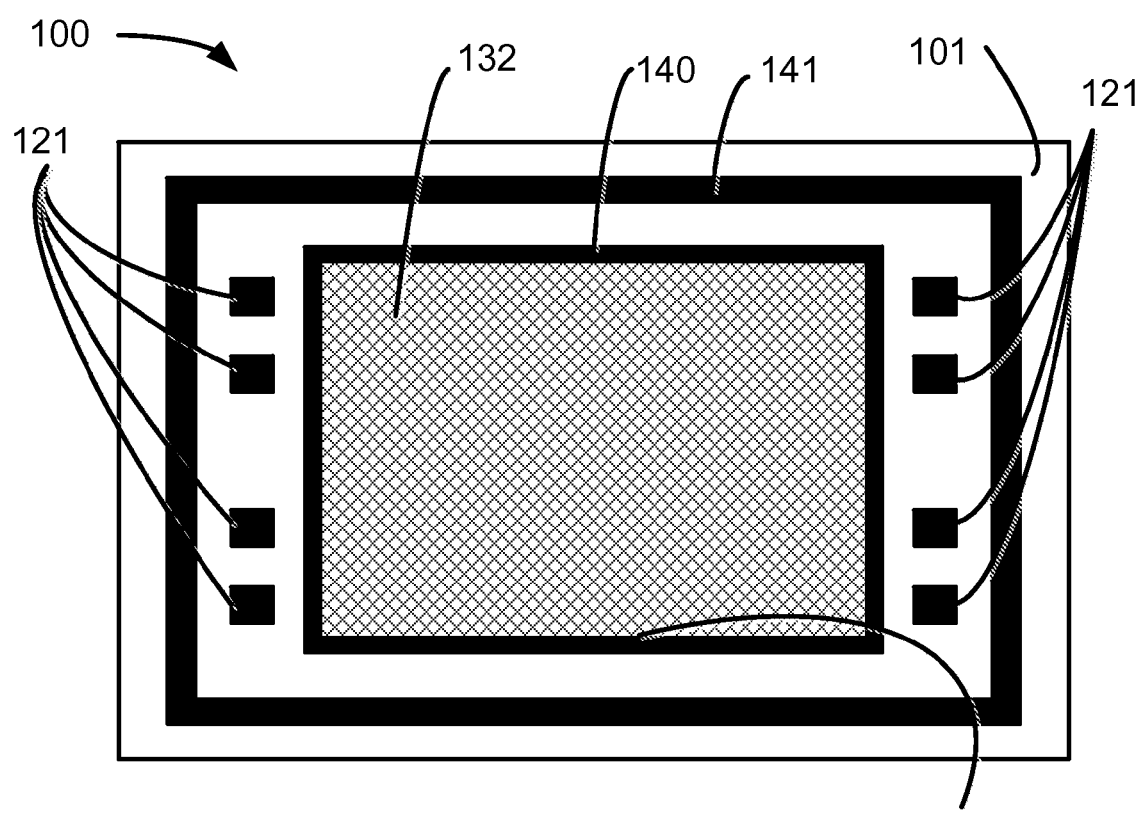

FIG. 1C schematically illustrates a cross-section of device 100 at line A'-A', and shows shield layer 132 spanning the inner seal ring 140 to completely shield the MEMS cavity 110 below. Indeed, in some embodiments, the seal ring 140 is also impervious to gas outgassed from the cap 130, and the seal ring 140 and the shield layer 132 cooperate to make the MEMS cavity 110 hermetically isolated from such gas.

In the example embodiment of FIG. 1A, the device 100 may be described as having two sub-cavities 110, 120 under same ASIC cap roof 130 to segregate the sensing structure 102 from the cap/sensor interconnect pads 121 with metal seal rings 140, 141, and as disposing the conducting metal shield layer 132 to completely cover one of the subcavities 110 below the ASIC roof 130 to block outgassing from the ASIC 130. As such, the MEMS sensor structure 102 can stay in a low pressure environment (or other desired initial environment) in cavity 110 set by wafer bonding process, and at the same time the interconnect metals 121 located within the second cavity 121 can outgas without adversely impacting the MEMS sensing structure 102.

Figure 1D:
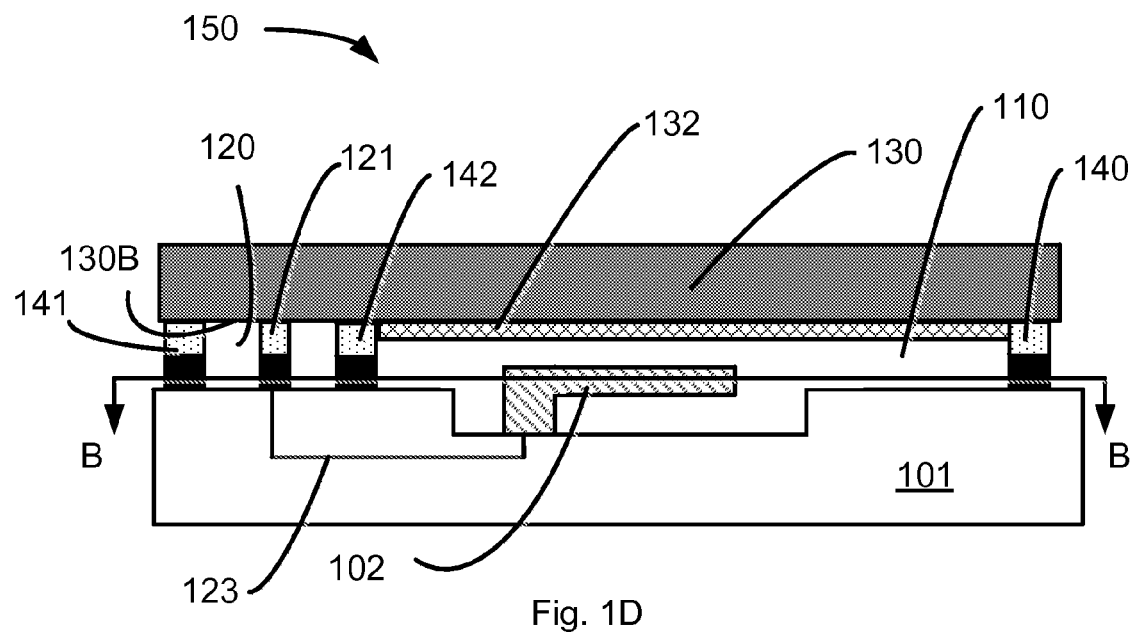
FIGS. 1D and 1E schematically illustrate a second embodiment of a capped MEMS device having a MEMS chamber that is hermetically isolated from interconnections.
Figure 1E:
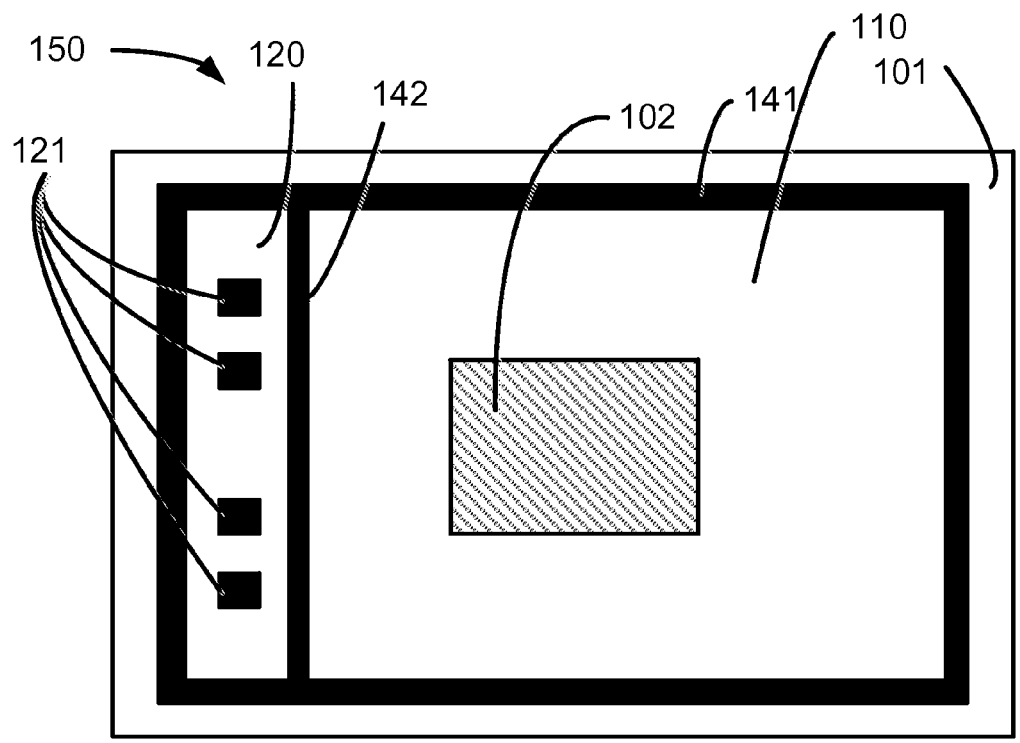

An alternate embodiment of a MEMS device 150 is schematically illustrated in FIG. 1D and FIG. 1E. FIG. 1E schematically illustrates a cross-section of device 150 along line B-B, but also shows some of the substrate 101, for reference.

The MEMS device 150 includes many of the same features as the device 100 described above and schematically illustrated in FIG. 1A and FIG. 1B. In this embodiment 150, however, the two cavities 110 and 120 share a common dividing wall 142. In other words, the two cavities 110 and 120 as both defined by the common dividing wall 142, and the dividing wall 142 separates cavity 110 from cavity 120. Indeed, the dividing wall 142 may be part of the seal ring 141. As such, the MEMS cavity 110 and the interconnection cavity 120 are immediately adjacent to one another.

Figure 1F:
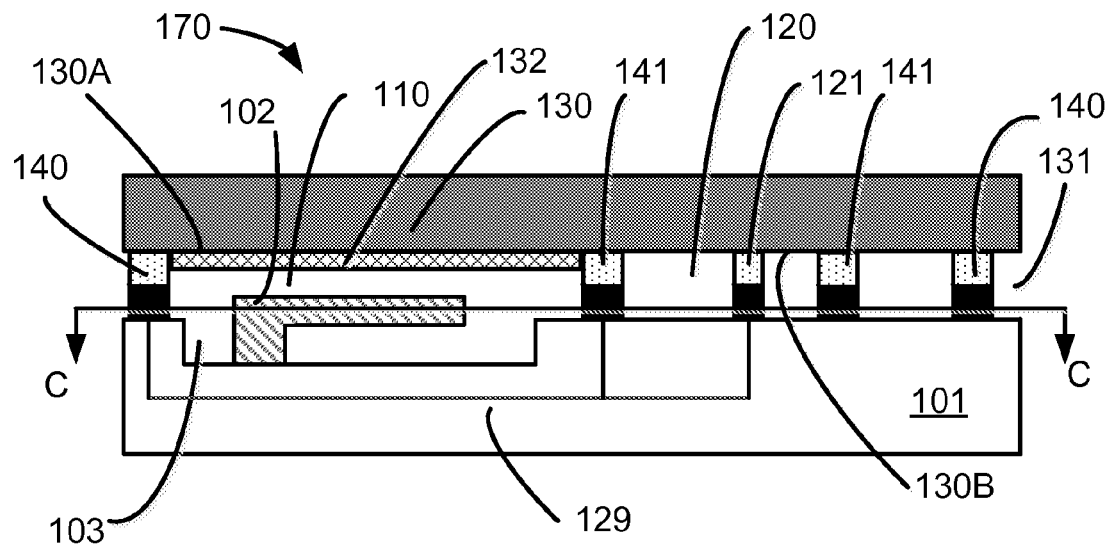
FIGS. 1F and 1G and 1H schematically illustrate a third embodiment of a capped MEMS device having a MEMS chamber that is hermetically isolated from interconnections.
Figure 1G:
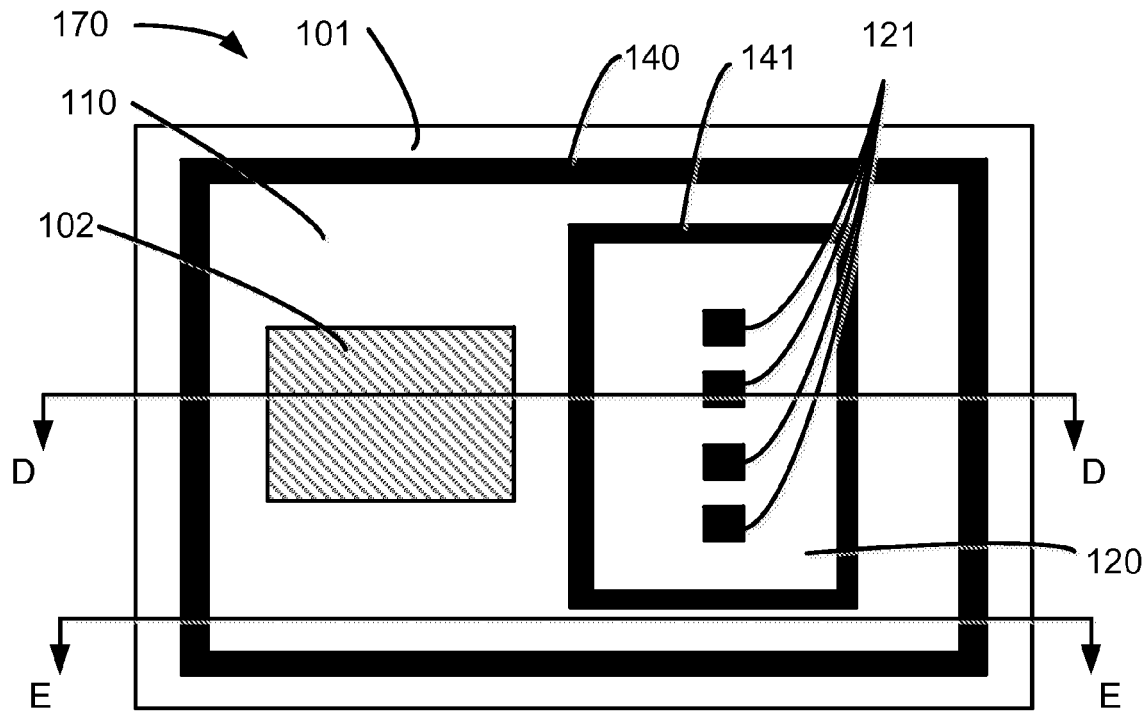
Figure 1H:
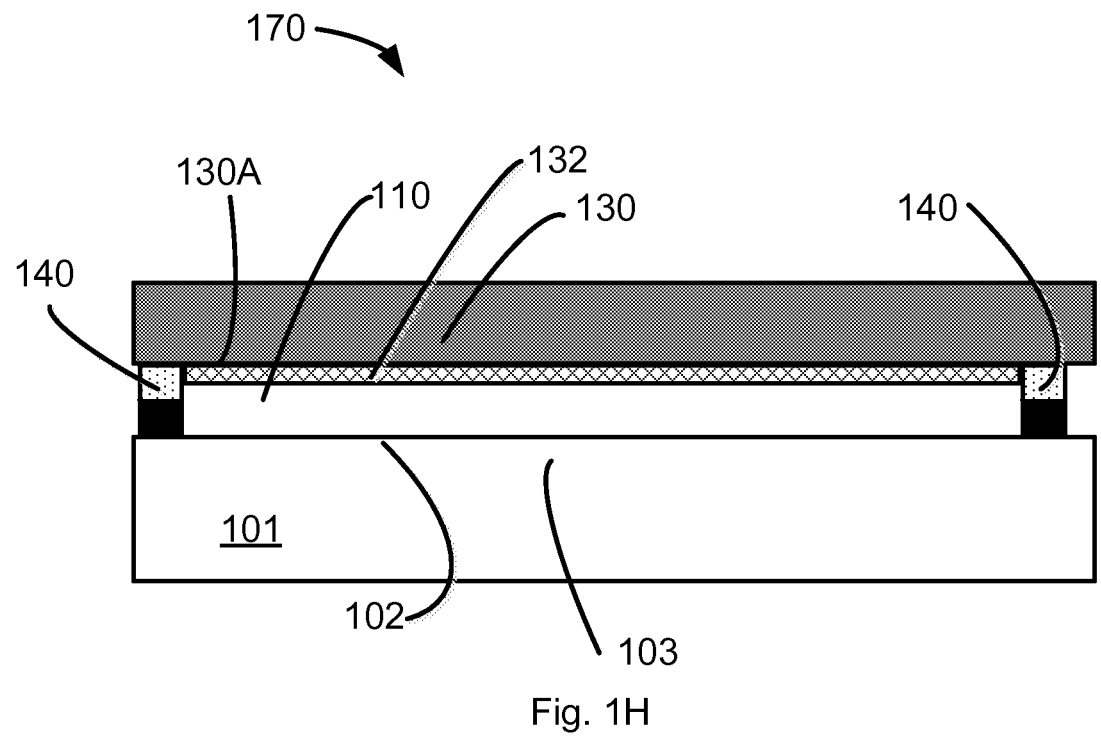

Yet another embodiment of a MEMS device 170 is schematically illustrated in FIG. 1F, FIG. 1G, and FIG. 1H. FIG. 1G schematically illustrates a cross-section of device 170 along line C-C, but also shows some of the substrate 101, for reference. Similarly, FIG. 1F schematically illustrates a cross-section of device 170 along line D-D. FIG. 1H schematically illustrates a cross-section of device 170 along line E-E, and shows that the shield layer 132 extends across the entire width of the cavity.

The MEMS device 170 includes many of the same features as the device 100 described above and schematically illustrated in FIG. 1A and FIG. 1B. The substrate 101 and the cap 130 are coupled together by a seal ring 140 and second seal ring 141. Either or both of the seal rings 140, 141, may be metal, or a glass frit for example. Both seal rings 140, 141 extend across the capping gap 131, so that the substrate 101, the cap 130, and the seal rings 140, 141 form the two hermetically sealed cavities 110 and 120. More specifically, the inner seal ring 141 circumscribes the interconnections 121, and forms hermetic cavity 120 (the interconnection cavity) along with the substrate 101 and the cap 130. The outer seal ring 140 circumscribes the inner seal ring 141, and therefore circumscribes the inner interconnection cavity 120, to form outer MEMS cavity 110. The inner seal ring 141 circumscribes the connectors 121, so that the connectors 121 are hermetically sealed within the interconnection cavity 120. As such, in this embodiment, the outer cavity 110 may be described as having an annular shape around the interconnection cavity 120.

In various embodiments, including without limitation those embodiments described above, the shield layer 132 and/or isolation walls 140, 142 may be biased to a predetermined electrical potential, such as a fixed ("D.C.") voltage, or ground potential, for example. The bias potential may be provided to the shield layer 132 by an electrical conductor 139 in the cap 130 as schematically illustrated in FIG. 2A for example, or by an electrical conductor 129 in the MEMS substrate 101 via one of the interconnect 121 or barrier walls 140 or 142, for example, as schematically illustrated in FIG. 1F. As such, in some embodiments, the shield layer 132 performs a dual function: it provides an outgassing shield to isolate (in conjunction with other structures) a MEMS cavity from gas outgassed from the cap 130, and it provides an electrical bias plate adjacent to the MEMs cavity 110.

In some embodiments, the MEMS substrate 101 may include a plane, such as a ground plane 107. For example, a device 100 with a ground plane 107 is schematically illustrated in FIG. 1A, although any of the embodiments described herein may have such a ground plane. The ground plane may be a doped layer in the substrate 101, or may be a structure on the substrate 101. In such embodiments, the shield layer 132 may be biased to the same voltage (e.g., ground) as the ground plane 107. Among other things, this may serve to mitigate or equalize electrostatic forces acting on a MEMS structure 102 from the ground plane 107, by providing a counterbalancing electrostatic force from the shield layer 132.

An embodiment of a method 300 of fabricating a MEMS device is schematically illustrated in FIG. 3A. For purposes of illustration, various components of an exemplary MEMS 100, from FIG. 1A, are schematically illustrated in FIG. 3B. However, the method 300 is the essentially the same for the other embodiments described herein.

The method 300 begins at step 301 by providing a cap 130, such as the caps described above. In this embodiment, the cap includes the shield layer 132 on surface 130A of the cap 130, although other embodiments may provide the shield layer separately. Indeed, in some embodiments, the shield layer 132 may be fabricated on the cap 130 along with other features, such as isolation walls 140, 141, or 142, for example. Examples of such embodiments are described below.

The method also includes providing isolation walls at step 302, and interconnections at step 303. In some embodiments, the isolation walls, such as isolation walls 140, 141, are provided contemporaneously with the interconnections 121, but in other embodiments they are provided separately. In some embodiments, the isolation walls 140, 141 are fabricated on the cap 130 or on a substrate 101 prior to the assembly of the device 100. See, for example, FIG. 5F and FIG. 6F. In such embodiments, the isolations walls may be fabricated by depositing metal on a cap 130 or substrate 101, and patterning the metal to form the isolation walls 140, 141. In other embodiments, one or both of the isolation walls 140, 141 may be glass frits disposed between the cap 130 and the substrate 101 during assembly.

The method 300 provides a substrate 101 at step 304. The substrate includes a MEMS structure 102, and in some embodiments the MEMS structure 102 is released; that is, the MEMS structure 102 is already movable with respect to the substrate 101. The MEMS structure 102 may be fabricated on, or from, the substrate 101 by various methods and processes known in the art. In addition, the MEMS structure 102 may move in a variety of orientations with respect to the substrate. For example, in an accelerometer or gyroscope, the MEMS structure may move parallel to the surface 101A of the substrate 101. In a switch or relay, or in some accelerometers or gyroscopes, the MEMS structure 102 may move in the direction of the surface 101A of the substrate 101.

The method 300, at step 305, then couples the cap 130 to the substrate 101 according to methods known in the art, such that the isolation walls 140, 141 and interconnections 121 are disposed between the cap 130 and the substrate 101, and span the capping gap 131 (see, e.g., FIG. 1). In a typical embodiment, the surface 130A of the cap 130 is parallel to the surface 101A of the substrate 101, and the MEMS structure 102 is hermetically sealed within the MEMS cavity 110. Interconnections 121 physically and electrically couple to corresponding conductors (e.g., through-silicon vias, or other conductors) on or in the cap 130.

Typically, the coupling step 305 occurs in a controlled environment. The controlled characteristics of the capping environment may include, for example the chemical content, temperature and pressure of the gas (if any) of the capping environment (and therefore within one or more of the cavities of a device) the cavity at the time of capping. For example, a device may be capped (step 305) in a vacuum, such that the MEMS cavity 110 and the interconnection cavity 120 hold a vacuum. Alternately, in some embodiments, the capping environment includes a gas (e.g., air, nitrogen, etc.), and such gas may be at a low pressure (i.e., gas pressure less than 1 atmosphere), or high pressure (i.e., gas pressure greater than 1 atmosphere), or even at one atmosphere. In any case, when the device is capped at step 305, some of that environment will be trapped in one or both of the MEMS cavity 110 and the interconnection cavity 120. The environment within such a cavity at the moment of capping is the initial internal environment of that cavity. It is known in the art that the performance characteristics of a movable MEMS structure may be influenced by the environment in which the movable MEMS structure is sealed. As such, in some MEMS devices it is important to maintain that environment by, for example, preventing the escape of gas from the environment, and preventing the entry of gasses from outside the environment by, for example, breach of a hermetic seal or reception of gasses from outgassing of other device components.

At this point, several observations will serve to supplement the description of the method 300. First, the steps may be performed in different orders than those described above. For example, steps 301-304 may be performed in any order (e.g., 301-304-303-302; 304-301-303-302; etc.). Second, step 302 (provide isolation walls) and step 303 (provide interconnections) may be combined, for example if those features are formed on one of the cap 130 or substrate 101. Indeed, in such a case, steps 302 and 303 may be combined with, or be a part of, either step 301 (provide cap) or 304 (provide substrate). Third, although FIG. 3A and FIG. 3B are described as producing a single device 100, the method 300 may be performed at the wafer level, in which a wafer of substrates is coupled to a wafer of caps, and the combined wafers are then diced to yield several individual devices 100.

Figure 4:
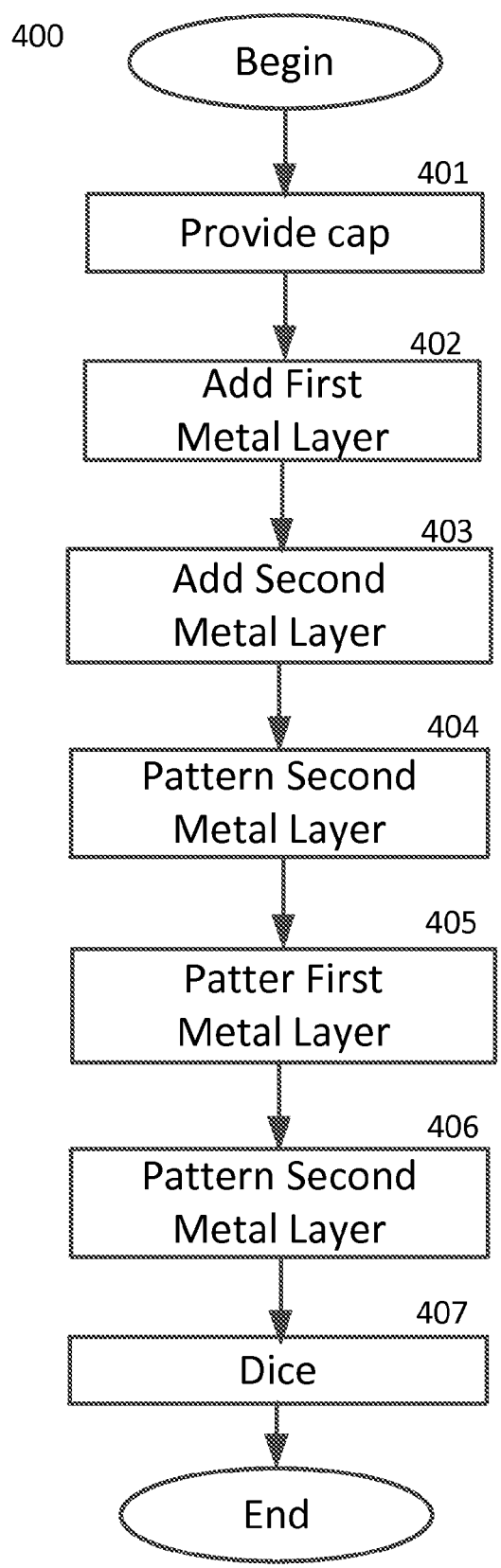
FIG. 4 is a flow chart that schematically illustrates an embodiment of a method of fabricating a cap.

FIG. 4 schematically illustrates embodiments of methods 400 of fabricating a cap (e.g., cap 130), and FIGS. 5A-5F and FIGS. 6A-6F schematically illustrate embodiments of caps 130 at various stages of fabrication, according to an embodiment in which the shield layer 132 and isolation walls 140, 141, 142 are fabricated on a surface 130A of the cap 130.

Figure 5A:
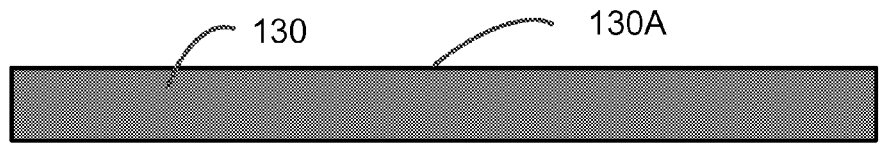
FIGS. 5A-5F schematically illustrate embodiments of a cap at various stages of production according to the flow chart of FIG. 4.

The method begins at step 401 by providing the cap 130. The cap may be a silicon member, such as part of a wafer, or may be an integrated circuit or part of a wafer of integrated circuits (e.g., ASICs) as described above. Such a cap is schematically illustrated in FIG. 5A and in FIG. 6A.

Figure 6A:
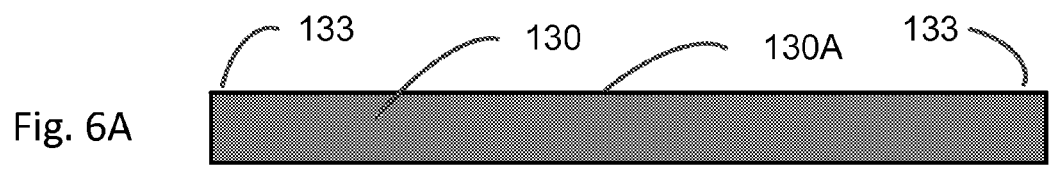
FIGS. 6A-6F schematically illustrate alternate embodiments of a cap at various stages of production according to the flow chart of FIG. 4.

At step 402, the method 400 adds a first metal layer 501 to a surface 130A of the cap 130. In some embodiments, the first metal layer may be titanium-nitride, for example. As schematically illustrated in FIGS. 5A and 6A, the first metal layer 501 completely covers the surface 130A of the cap 130, in both the portions of that surface 130A that will face the MEMS cavity 110, and in the portions of that surface 130A that will face the interconnection cavity 120. The portions of that surface 130A that will face the interconnection cavity 120 will be removed at a later step, so that the interconnections 121 may physically and electrically couple to the cap 130.

Figure 5B:
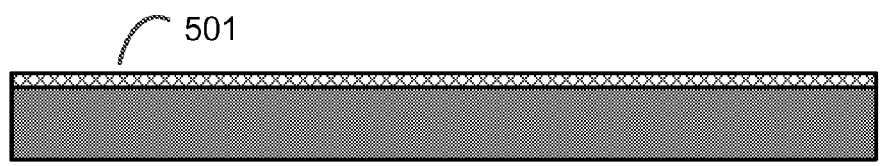
Figure 5C:
Figure 6B:
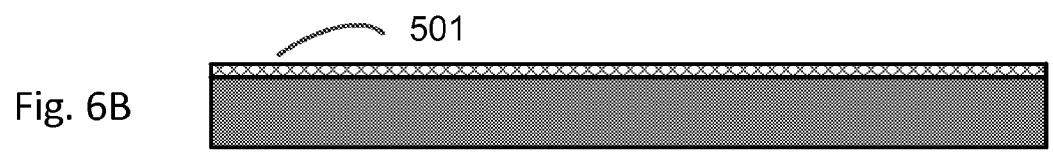
Figure 6C:
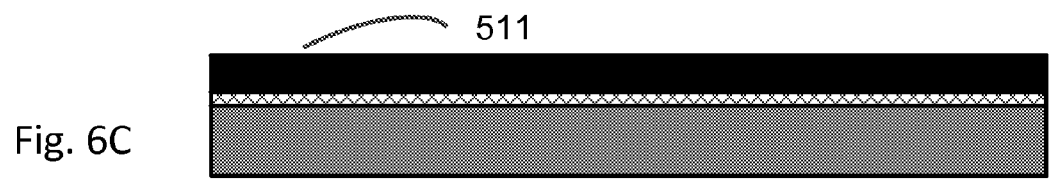

Next, at step 403, a second metal layer 511 is deposited onto the first metal layer 501, and likewise covers the first metal layer 501, as schematically illustrated in FIG. 5B and FIG. 6B, for example. In some embodiments, the second metal layer 511 may be aluminum-copper ("AlCu"), for example.

Figure 5D:
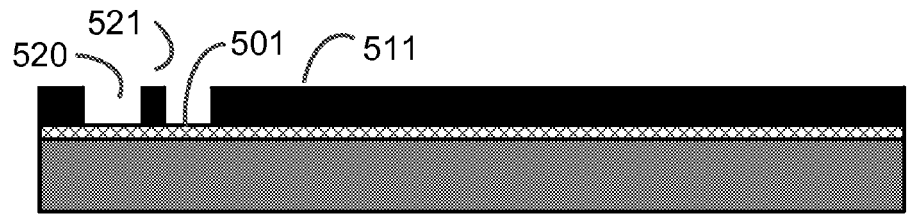
Figure 6D:
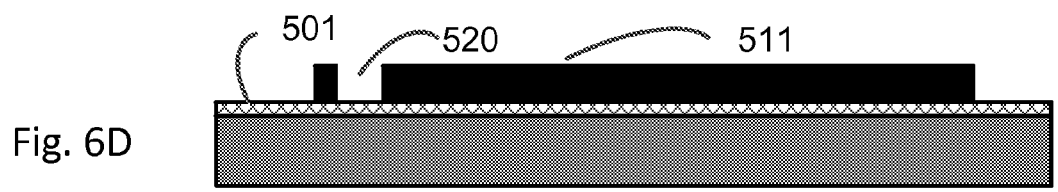

The method then patterns the second metal layer 511 at step 404, to expose the first metal layer 501 at one or more places, as schematically illustrated in FIG. 5D and FIG. 6D. As shown, the walls (e.g., walls 140, 141, 142) and interconnections 121 have been at least partially formed at this stage.

In some embodiments, as schematically illustrated in FIG. 5D, the second metal layer 511 is patterned to expose the first metal layer 501 so as to form a void 520 that will later form part of interconnect cavity 121, and to leave a structure 521 that will later be part of an interconnect 121.

In other embodiments, as schematically illustrated in FIG. 6D, the second metal layer 511 is similarly patterned to expose the first metal layer 501 so as to form a void 520 that will later form part of interconnect cavity 121, and to leave a structure 521 that will later be part of an interconnect 121. However, step 403 may also pattern the second metal 511 layer so as to leave a space 530 at one or both ends 133 of the wafer 130. The space or spaces 530 are configured to accept a glass frit or other bonding agent to bond the cap 130 to a substrate 101, and/or to accept solder balls 202, as schematically illustrated in FIGS. 2B and 2C, for example.

Figure 5E:
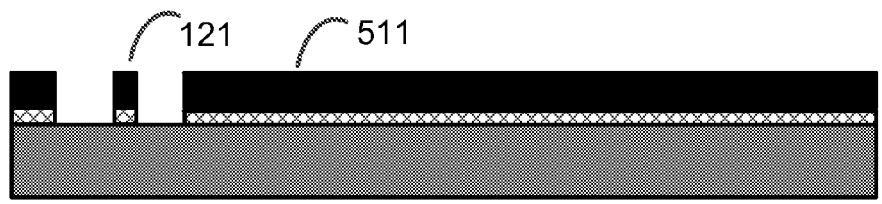
Figure 6E:
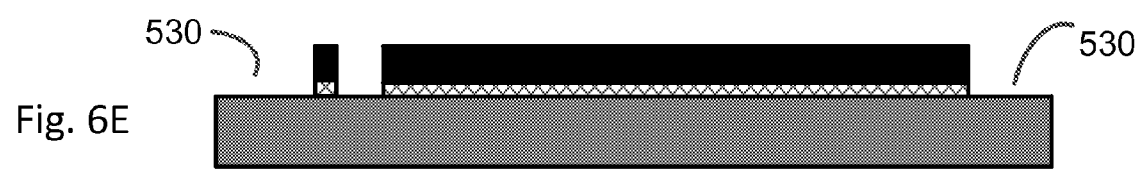

At step 405, the method 400 patterns the first metal layer 501 to expose the surface 130A of the cap 130 through the patterned second metal layer 511, as schematically illustrated in FIG. 5E, and/or to expose the ends 133 of the cap 130, as schematically illustrated in FIG. 6E. The exposed portion 130B of the cap 130 may be referred to as a "bare" portion of the cap surface 130A. Both FIG. 5E and FIG. 6E reveal that, by step 405, the interconnection 121 has been fully formed as an integral part of the cap 130.

Figure 5F:
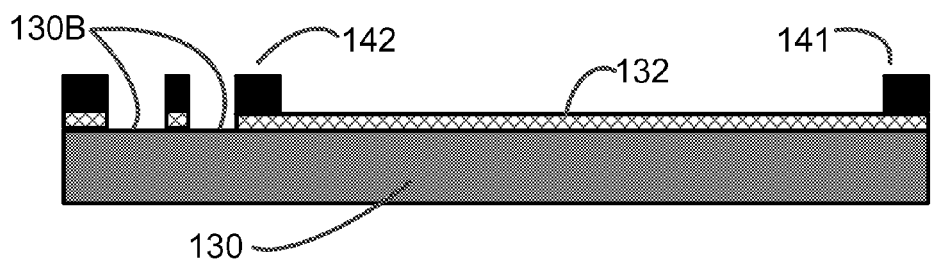
Figure 6F:
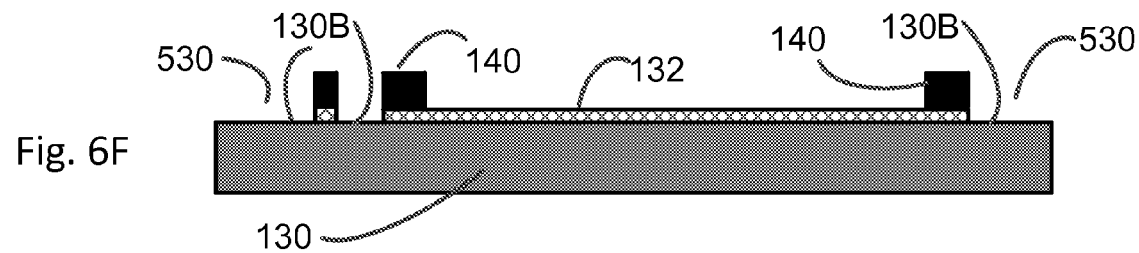

At step 406, the method 400 patterns the second metal layer 511 for a second time, to expose the first metal layer, as schematically illustrated in FIG. 5F and FIG. 6F. Alternately, the patterning described in step 406 may be performed as part of step 404. Both FIG. 5F and FIG. 6F reveal that, after step 406, the shield layer 132 covers the entire surface 130A of the cap 130 in the area circumscribed by the isolation walls 141 and 142 of FIG. 5F, and by isolation wall 140 in FIG. 6F. Indeed, in both embodiments, the shield layer 132 and the isolation walls (140; 141 and 142) are integrally interconnected. Indeed, the shield layer 132 may and the isolation walls (140; 141 and 142) share a common metal layer 501. As such, any outgassing from the cap 130 will be prevented from entering the MEMS cavity 110, because the shield layer 132 is impermeable to the contents of such outgassing and serves as a barrier.

Some embodiments may fabricate devices in a batch format, such as by making many devices on a single wafer. In such embodiments, the wafer may be sawed, cut or diced at step 407 to separate the individual devices (e.g., 100, 170, 200, 250, etc.) from the wafer. For example, in some embodiments, each individual device is a die that is not physically connected to any other device from its wafer, and each device has a single cap 130 and single MEMS substrate 110, and only two cavities 110 and 120.

As schematically illustrated in FIG. 5F, the patterning of the second metal layer 511 forms a portion of isolation wall 141 and 142 (e.g., see FIG. 1D, FIG. 1E) and the exposed first metal layer 511 forms a shield layer 132, as described above.

In a preferred embodiment, the second metal layer 511 is patterned such that the isolation walls 141, 142 are at least 5 microns in width at the surface that is parallel to the surface 130A of the cap 130. As schematically illustrated in FIG. 6F the patterning of the second metal layer 511 forms a portion of isolation wall 140 having a surface that is at least 5 microns in width at the surface that is parallel to the surface 130A of the cap 130.

Figure 7A:
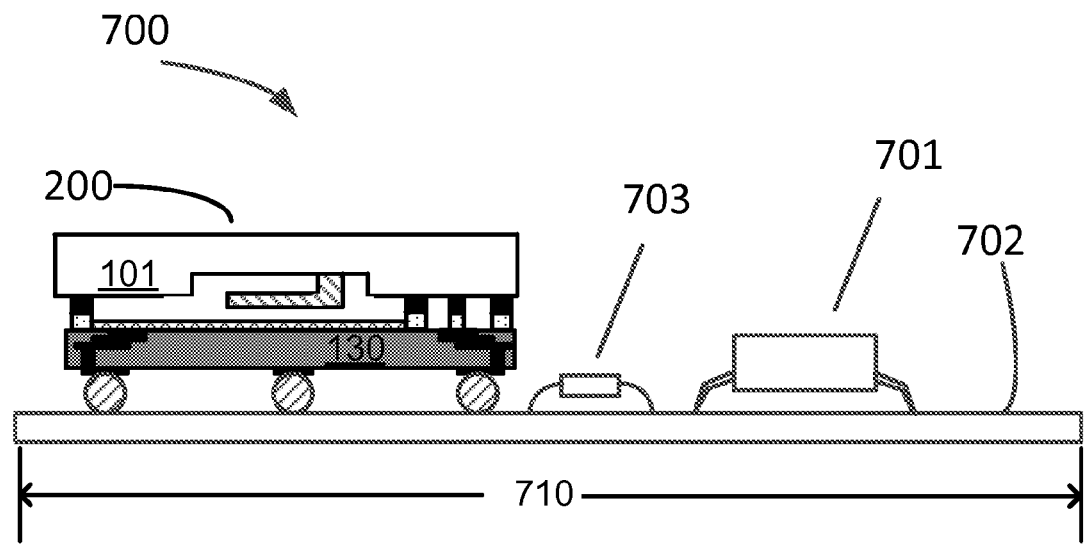
FIG. 7A schematically illustrates an illustrative embodiment of a capped MEMS device having a MEMS chamber that is hermetically isolated from interconnections, as mounted on a printed circuit board.
Figure 7B:
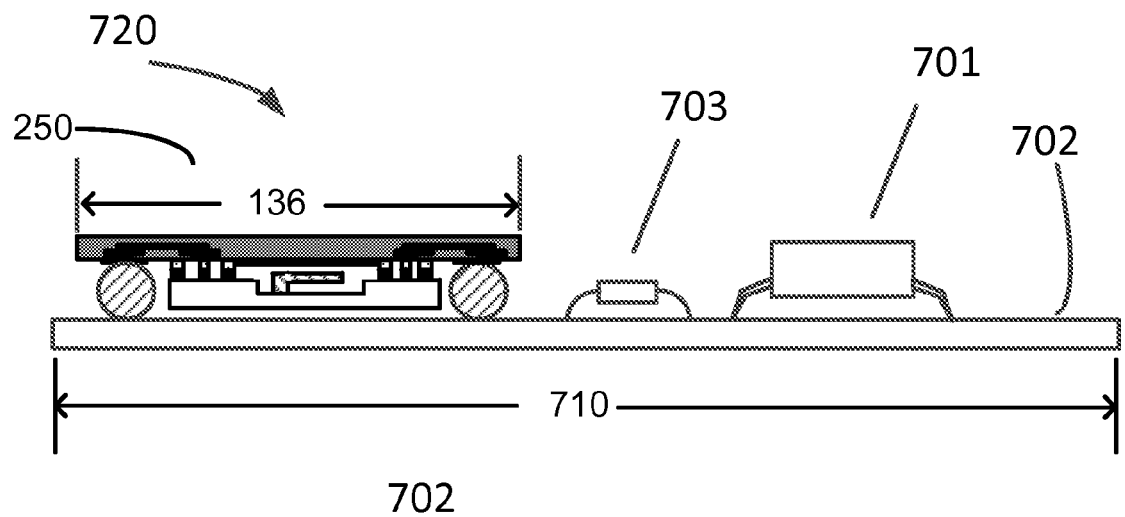
FIG. 7B schematically illustrates an alternate embodiment of a capped MEMS device having a MEMS chamber that is hermetically isolated from interconnections, as mounted on a printed circuit board.

The various embodiments of capped sensors described above may be used in a variety of applications. For example, a sensor 200 may be coupled to a substrate 702, such as a printed circuit board for example, and may thereby be electrically interconnected to other electrical elements, such as passive devices (e.g., 703) and integrated circuits (e.g., 701), all as schematically illustrated by assembly 700 in FIG. 7A for example. Although the embodiment in FIG. 7A schematically illustrated device 200 coupled to the substrate 702, any of the embodiments described herein (e.g., device 100, device 150, device 170) could be similarly used. For example, FIG. 7B schematically illustrates sensor 250 coupled to a substrate 702. As illustrated, the length 710 of the substrate 702 is considerably longer that the length 136 of the cap 130. For example, in some embodiments the length 710 of the substrate 702 is at least 2 or 3 times the length 136 of the cap 130.

The embodiments of the invention described above are intended to be merely exemplary; numerous variations and modifications will be apparent to those skilled in the art. All such variations and modifications are intended to be within the scope of the present invention as defined in any appended claims.

What is claimed is:

1. A capped micromachined device comprising:
   a substrate comprising a MEMS device;
   a semiconductor cap separated from the substrate by a capping gap;
   an inner isolation wall disposed between the substrate and the semiconductor cap and spanning the capping gap, the inner isolation wall and the substrate defining a MEMS chamber enclosing the MEMS device; and
   an impermeable to gas shield layer disposed between the semiconductor cap and the MEMS chamber sealing the MEMS chamber from the semiconductor cap to provide a complete outgas barrier between the semiconductor cap and the MEMS chamber.

2. The capped micromachined device of claim 1, wherein the impermeable to gas shield layer comprises one of titanium nitride, a titanium and titanium nitride combination layer stack, Tungsten, Titanium Tungsten, or a metal silicide.

3. The capped micromachined device of claim 1, wherein the semiconductor cap comprises an integrated circuit including a plurality of active semiconductor devices.

4. The capped micromachined device of claim 3, wherein the integrated circuit of the semiconductor cap is configured to process output signals from the MEMS device.

5. The capped micromachined device of claim 3, further comprising an electrical connection electrically coupling the MEMS device and the integrated circuit, wherein the electrical connection is isolated from the MEMS chamber.

6. The capped micromachined device of claim 1, wherein the MEMS device comprises one of an accelerometer beam, a gyroscopic structure, or a switch arm.

7. The capped micromachined device of claim 1, wherein the inner isolation wall includes an outgas sing wall portion, and wherein the impermeable to gas shield layer extends over the outgassing wall portion to seal the MEMS chamber from the outgassing wall portion to provide the complete outgas barrier between the semiconductor cap and the MEMS chamber.

8. The capped micromachined device of claim 1, wherein the inner isolation wall comprises one of a solder ring or a glass frit.

9. The capped micromachined device of claim 1, further comprising:
   an outer isolation wall defining a gap between the inner and outer isolation walls.

10. The capped micromachined device of claim 1, further comprising:
    an electrical conductor coupled to the MEMS device, wherein the electrical conductor is isolated from the MEMS chamber.

11. A cap for forming a capped micromachined device having a MEMS chamber, the cap comprising:
    a cap wafer;
    an isolation wall defining a MEMS chamber portion of the cap wafer; and
    an impermeable to gas shield layer disposed on at least the MEMS chamber portion of the cap wafer for providing a complete outgas barrier between the cap wafer and the MEMS chamber.

12. The cap of claim 11, wherein the isolation wall includes an outgassing wall portion, and wherein the impermeable to gas shield layer extends over the outgassing wall portion for providing the complete outgas barrier between the outgas sing wall portion and the MEMS chamber.

13. The cap of claim 11, wherein the cap wafer comprises an integrated circuit including a plurality of active semiconductor devices.

14. The cap of claim 13, wherein the integrated circuit includes circuitry to process output signals from the micromachined device.

15. The cap of claim 13, wherein the cap wafer includes an electrical connection for electrically coupling the integrated circuit to the micromachined device, wherein the electrical connection is outside of the MEMS chamber portion.

16. The cap of claim 11, wherein the impermeable to gas shield layer comprises one of titanium nitride, a titanium and titanium nitride combination layer stack, Tungsten, Titanium Tungsten, or a metal silicide.

17. A method of fabricating a capped micromachined device comprising:
    preparing a cap having an impermeable to gas shield layer on at least a MEMS chamber portion of the cap; and
    coupling the cap to a substrate such that (a) an isolation wall spans a capping gap between the cap and the substrate and (b) the cap and the isolation wall define a hermetically-sealed MEMS chamber enclosing a MEMS device on the substrate, the impermeable to gas shield layer sealing the MEMS chamber from the cap so as to provide a complete outgas barrier between the cap and the MEMS chamber.

18. The method of claim 17, wherein the cap includes the isolation wall, the isolation wall includes an outgassing wall portion, and the impermeable to gas shield layer extends over the outgassing wall portion to provide the complete outgas barrier between the outgassing wall portion and the MEMS chamber.

19. The method of claim 17, wherein:
    the cap comprises an integrated circuit including a plurality of active semiconductor devices and further comprises an electrical connection for electrically coupling the integrated circuit to the MEMS device;
    the electrical connection is outside of the MEMS chamber portion; and
    coupling the cap to the substrate coupled the electrical connection to the MEMS device.

20. The method of claim 17, wherein the isolation wall is separate from the cap and the substrate, and wherein coupling the cap to the substrate comprises disposing the isolation wall between the cap and the substrate.

* * * * *